United States Patent [19]
Dickirson et al.

[11] Patent Number: 5,219,292
[45] Date of Patent: Jun. 15, 1993

[54] PRINTED CIRCUIT BOARD INTERCONNECTION

[75] Inventors: David M. Dickirson, Boca Raton; Ralph E. Digiacomo, Jr., Tamarac, both of Fla.

[73] Assignee: Motorola, Inc., Schaumburg, Ill.

[21] Appl. No.: 862,943

[22] Filed: Apr. 3, 1992

[51] Int. Cl.⁵ ............................................. H01R 9/09
[52] U.S. Cl. ....................................... 439/67; 439/65
[58] Field of Search ................. 439/67, 77, 65, 493, 439/495, 931

[56] References Cited

U.S. PATENT DOCUMENTS

| | | | |
|---|---|---|---|
| 3,214,725 | 10/1965 | de Rose et al. | 439/497 |
| 3,221,286 | 11/1965 | Fedde | 439/65 |
| 3,772,776 | 11/1973 | Weisenburger | 439/493 |
| 4,116,516 | 9/1978 | Griffin | 439/493 |
| 4,411,633 | 10/1983 | Waldron | 439/493 |
| 4,513,064 | 4/1985 | Marcus | 361/412 |

*Primary Examiner*—Neil Abrams
*Attorney, Agent, or Firm*—Dale W. Dorinski

[57] ABSTRACT

A printed circuit substrate interconnection is made between two printed circuit substrates. A first printed circuit substrate (10) is a laminate of at least two dielectric layers (12, 14), and has a first circuit pattern (16) disposed between the two layers. The circuit pattern terminates in one or more lands or pads (17) located near a vertical edge (13) of the layer. The second dielectric layer is laminated to the first layer, over the circuit pattern, so as to reveal the lands. A second printed circuit substrate (20) is a laminate of at least one dielectric layer (22), and has a second circuit pattern (26) terminating in one or more lands or pads (27) located near a vertical edge (23) of the layer, and in a pattern corresponding to the lands of the first circuit pattern. The first printed circuit substrated (10) is coupled to the second printed circuit substrate (20) so as to co-operatively mate the two printed circuit substrates, forming an electrical interconnection between the first circuit pattern lands (17) and the second circuit pattern lands (27).

1 Claim, 6 Drawing Sheets

PRINTED CIRCUIT BOARD INTERCONNECTION

TECHNICAL FIELD

This invention relates generally to electrical connectors and more specifically to an interconnection between one or more printed circuit substrates.

BACKGROUND

Electronic assemblies having more than one printed circuit board or card need to have a means of interconnecting the circuit boards to each other. In some instances, cables are used to achieve these interconnections, each interconnection requiring a connector on one or both ends. Connectors are used to permit the functional units, such as cards or circuit boards, to be individually inserted and removed for reasons of testability, manufacturing costs, repair, and changes for upgrading equipment or installation of optional features in the field. A connector is typically defined as a device to repeatedly separate and reconnect pathways in an electronic system. The connector provides a separable interface between the boundaries of two electronic elements. These electronic elements may be different, similar, or identical. Connections between printed circuit boards and flex circuits are also widely used. In connecting two or more printed circuit boards, a mother/daughter board connection is typical.

In order to separably connect an element or printed circuit board A to element or a second printed circuit board B, there are typically three interfaces that must be satisfied, each of which must provide a signal path and an appropriate mechanical structure. The first interface connects the first printed circuit board to a connector, the second interface connects the first connector to a second connector and the third interface is between the second connector and the second printed circuit board. Implicit in the requirement for a separable connection, the connecting system must also have the following capabilities. 1) fit the elements to be connected, 2) align the elements, 3) actuate the connection, 4) satisfy the performance specification, 5) resist the forces which could degrade the connection, 6) permit contact separation when required, 7) survive in superior operating order for the product life, and 8) provide good electrical performance.

Typically, in connecting two printed circuit boards, a card-edge connector or similar device is used. The card-edge connector is typically a plastic component with numerous electrical contacts which are soldered directly to a printed circuit board. The second printed circuit board may be inserted directly into the card-edge connector or it may have an additional corresponding connector soldered to it; in the second case, the two connectors are plugged together so as to provide a mechanical and electrical interconnection between the two circuit boards. Special types of connectors are used when connecting flexible films, such as flex circuits, to each other or to rigid circuit boards, and still other types of connectors are used when connecting cables to printed circuit boards.

In each of these situations, at least one or more additional components is required to interconnect the circuit boards. Interconnecting circuit elements using conventional means extracts a penalty in terms of space, volume, cost, complexity, and labor required to build the assembly. It would be advantageous if a scheme were devised that would completely eliminate the need for these connectors, and still provide a physical and electrical interconnection between one or more circuit boards. The elimination of these connectors would provide a significant advantage to the electronics industry in reducing the complexity, size, and cost of electrical interconnections in devices such as computers and other consumer electronic gear.

SUMMARY OF THE INVENTION

Briefly, according to the invention, a printed circuit substrate interconnection is provided. The interconnection comprises two printed circuit substrates. A first printed circuit substrate is a laminate of at least two dielectric layers, and has a first circuit pattern disposed between the two layers. The circuit pattern terminates in one or more lands or pads located near a vertical edge of the layer. The second dielectric layer is laminated to the first layer, over the circuit pattern, so as to reveal at least the lands. A second printed circuit substrate is a laminate of at least one dielectric layer, and has a second circuit pattern terminating in one or more lands or pads located near a vertical edge of the layer, and in a pattern corresponding to the lands of the first circuit pattern. The first printed circuit substrate is coupled to the second printed circuit substrate so as to co-operatively mate the two printed circuit substrates, forming an electrical interconnection between the first circuit pattern lands and the second circuit pattern lands.

In an further embodiment, a fastening means is employed to maintain the relative position of the first printed circuit substrate with respect to the second printed circuit substrate after the substrates are coupled.

In another embodiment, a conductive media is interposed between the first printed circuit substrate lands and the second printed circuit substrate lands so as to mechanically bond the substrates together. The conductive media may be a material such as solder, metal filled polymers, and carbon filled polymers.

In still another embodiment, the first printed circuit substrate further comprises a third dielectric layer. The layer has a circuit pattern terminating in one or more lands located near a vertical edge of the layer, and is laminated to the second dielectric layer with the circuit pattern facing the second dielectric layer so as to reveal at least the lands of the circuit pattern. The second printed circuit substrate further comprises an additional circuit pattern on an opposite side of the substrate, terminating in one or more lands. The lands are located near a vertical edge of the layer.

In other embodiments, additional dielectric layers are added to the second printed circuit substrate.

In still another embodiment, a method of interconnecting the two printed circuit substrates is provided. The first multilayer printed circuit board is coupled to the second printed circuit board by mating the respective surfaces so as to provide electrical interconnection between the respective metallization patterns of the first and second printed circuit boards via the respective pads.

DETAILED DESCRIPTION OF THE PREFERRED EMBODIMENT

Figure 1:
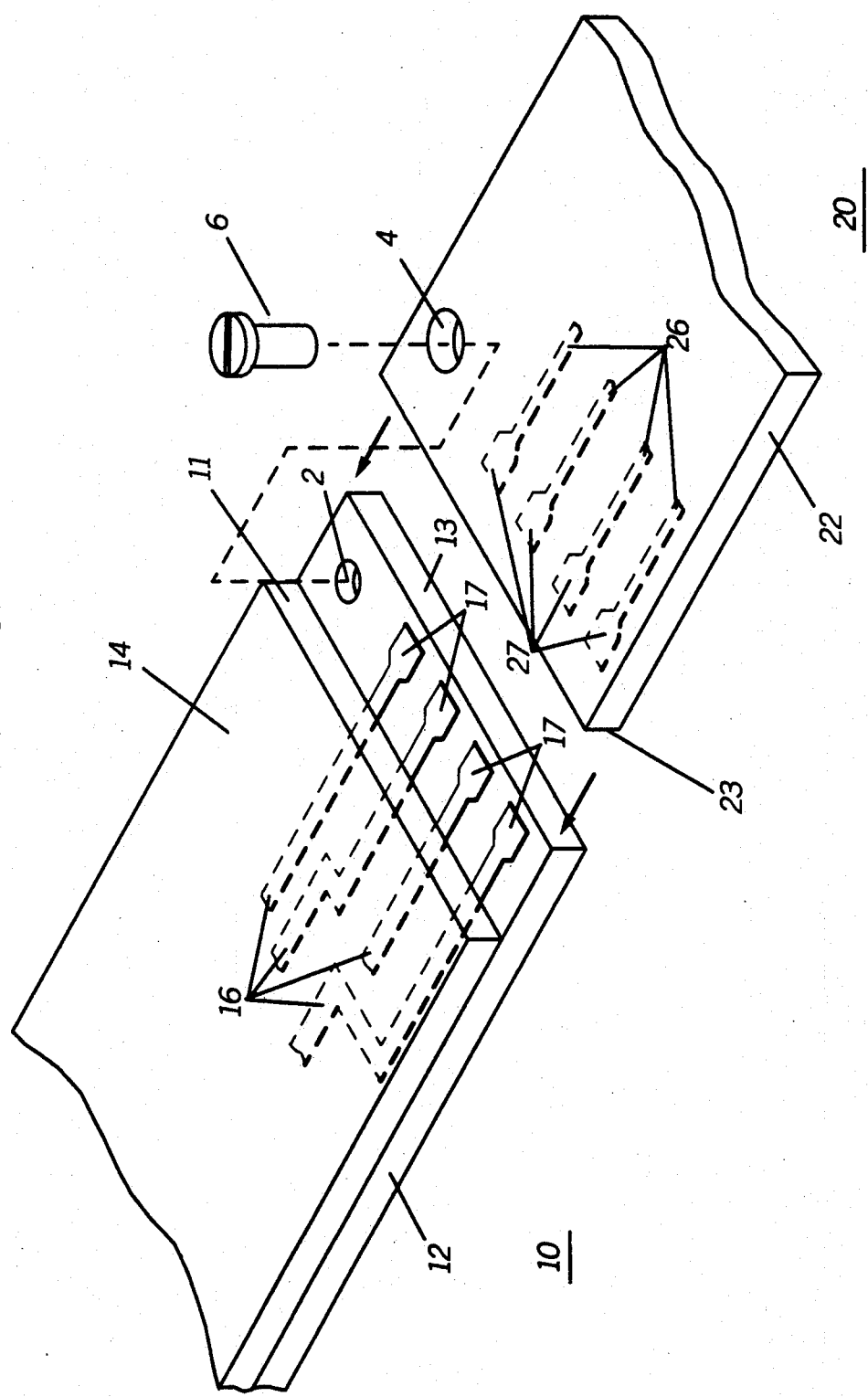
FIG. 1 is an exploded isometric view of the printed circuit board interconnection in accordance with the invention.

The structure of the present invention will now be described with the aid of reference numerals in the drawing figures. Referring to FIG. 1, the printed circuit board interconnection is shown in an isometric view.

A first printed circurit substrate 10 is provided so as to interconnect with a second printed circuit substrate 20. Each of the printed circuit substrates 10 and 20 may be a conventional rigid printed circuit board such as FR4, polyimide, polyester, etc., with glass reinforcement, or they may be flex circuits, such as MYLAR ® or polyimide flexible material or they may be combination of both. In the broadest embodiment, the first printed circuit substrate 10 consists of two layers of dielectric material 12 and 14. The dielectric materials are typically glass reinforced resins commonly known as "prepregs". Sandwiched between the two dielectric layers is a circuit pattern 16 consisting of a metallization layer typically made by imaging and plating copper. The circuit layer 16 is formed in a conventional manner, that is, by laminating a metal foil such as copper to a first dielectric layer 12 and delineating, imaging, and etching the circuit 16 into the copper foil as is customary in the printed circuit board art. The metallization or circuitry pattern 16 terminates in one or more pads, lands, or terminal areas 17 that are near the end of the dielectric layer 12.

The terminal area 17 will later serve as the interconnection area of the printed circuit board. The lands 17 are typically situated near a vertical edge 13 of the dielectric layer 12. A second dielectric layer 14 is laminated to the first dielectric layer 12 over the circuit pattern 16. The second dielectric layer 14 is formed so as to not cover the pads 17. As can be seen in the drawing, the second dielectric layer 14 does not extend to the edge 13 of the first dielectric layer 12 but is terminated some distance from the vertical edge. By doing so, the pads 17 of the circuit pattern 16 remain exposed while the remainder of the circuit pattern is buried or sandwiched between the two dielectric layers 12 and 14. A second printed circuit substrate 20 is formed of a single layer of dielectric material 22. A circuit pattern 26 is formed on the bottom side of the dielectric layer 22 in a manner similar to that of the first printed circuit substrate 10. The circuit pattern 26 also terminates in one or more pads or lands 27 that are situated near a vertical edge 23 of dielectric layer 22. The pads 27 correspond to the pads 17 of the first printed circuit substrate.

In order to form the interconnection between the first printed circuit substrate 10 and the second printed circuit substrate 20, the two printed circuit substrates are mated so as to provide an electrical interconnection between pads 17 and pads 27. When the interconnection is formed, the dielectric layer 22 lies partially on top of the dielectric layer 12 and vertical edge 23 of the second substrate 20 is juxtaposed against vertical edge 11 of the first substrate.

As a means to providing additional mechanical strength to the printed circuit board interconnect, a fastener 6 may be used to maintain the relative position of the first printed circuit substrate 10 with respect to the position of the second substrate 20, after assembly. The fasten means 6 may consist of a pin positioned through holes 2 and 4 in the first and second substrates. In addition to a simple pin, other fastening means, such as a screw, rivet, snap-fit, or nail may be used to provide the fastening. Other types of fasteners such as clips, may be used around the edges of the printed circuit assembly. Additionally, a conductive media (not shown) may be placed between the pads 17 of the first printed circuit substrate 10 and the pads 27 of the second printed circuit substrate 20. The conductive media may be any number of appropriate materials, but in the preferred embodiment, is a material such as a conductive epoxy. Other materials, such as solder or metal-filled or carbon-filled polymers such as conductive polyesters, conductive polyimides, conductive inks, or anisotropic adhesives may be used. Typical metals used to fill the conductive epoxy are well known to those skilled in the art and may consist of materials such as copper, silver, nickle, chrome, steel, stainless steel, gold, solder, and alloys of these various materials. The conductive adhesive provides both electrical interconnect between the pads 17 and the pads 27 and also adds mechanical structure or rigidity to the interconnection, thus maintaining the relative position of the two circuit substrates.

Although conductive materials and adhesives such as solder or conductive epoxies may be used to aid in the interconnection, the system may be used without additional conductive media. If so, the pads on each of the respective circuit substrates should be coated with a material that resists oxidation while providing good electrical conductivity. In the preferred embodiment, the pads on each of the printed circuit substrates are plated or coated with a material that resists oxidation, such as gold, solder, palladium, platinum, and alloys thereof In another embodiment of the invention, an additional dielectric layer may be added to the first printed circuit substrate.

Figure 2:
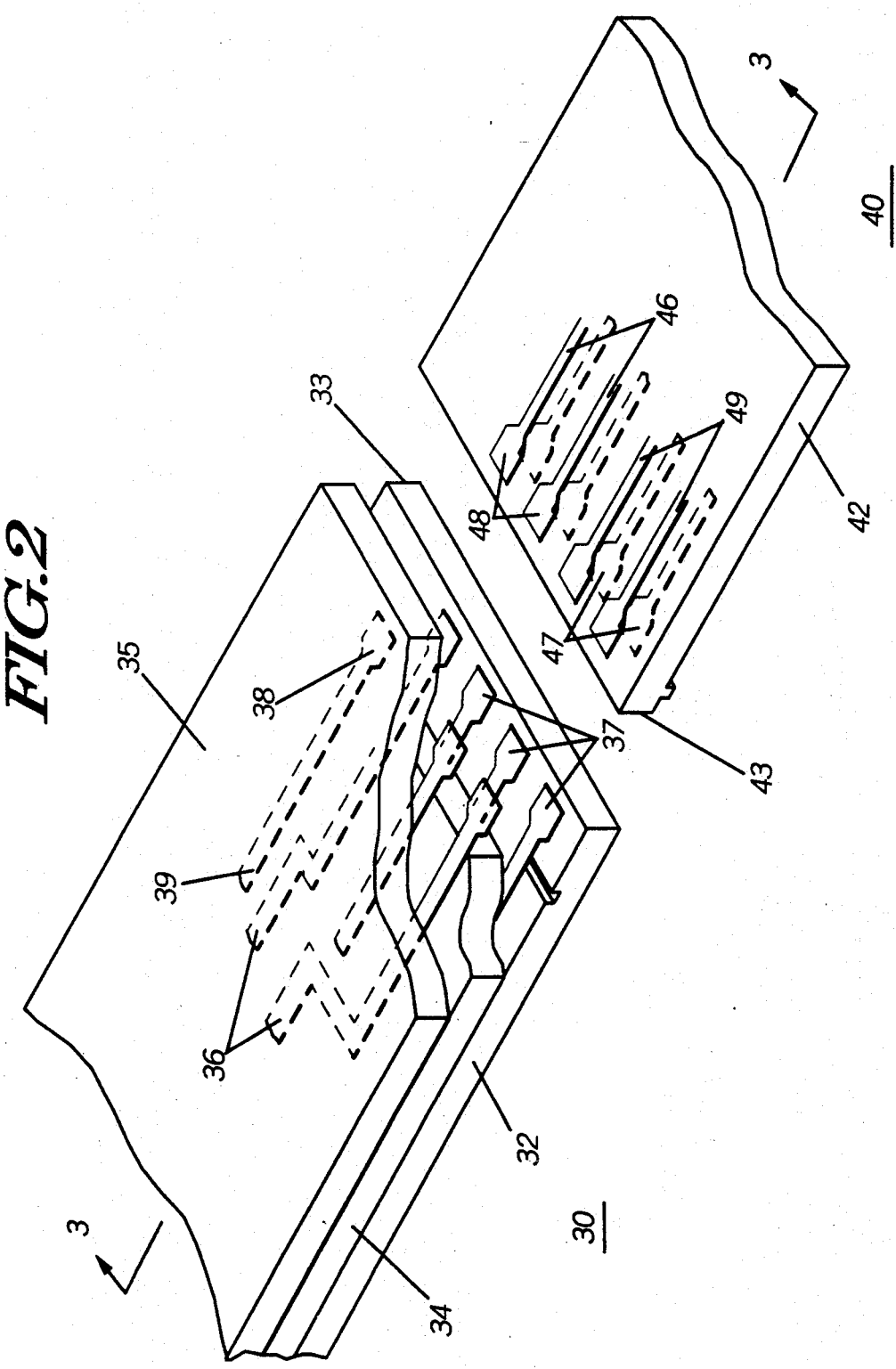
FIG. 2 is a cut-away isometric view of an alternate embodiment in accordance with the invention.
Figure 3:
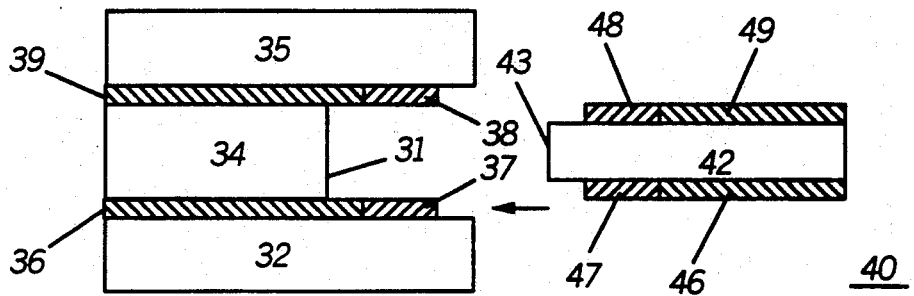
FIGS. 3, 4, and 5 are cross-sectional views of alternate embodiments of the invention.

Referring now to FIG. 2, a cut-away isometric view of an alternate embodiment of the invention, a third dielectric layer 35 is added to the structure previously elucidated. Dielectric layer 35 also has a metallization layer on the bottom side that is delineated in a circuit pattern 39 terminating in one or more lands or pads 38. In a manner similar to that explained previously, the pads 38 are situated near a vertical edge of the dielectric layer 35. When the third dielectric layer 35 is laminated to the second dielectric layer 34 of the structure, it is situated so that the circuit pattern 39 and the lands 38 are formed as a inner layer of the three-layer structure 30. Referring now to FIG. 3, a cross-sectional view of the structure shown in FIG. 2, it can be seen that circuit patterns 36 and 39 are buried or sandwiched in between each of the dielectric layers 32, 34, and 35 to create a multilayer printed circuit board. The center dielectric layer 34 is formed so as to reveal a portion of the circuit patterns 36 and 39 and also to reveal the pads 37 and 38 of the respective circuit patterns. In this way, a slot or groove is formed in the multilayer structure. Correspondingly, the second printed circuit substrate 40 is formed with circuit patterns 46 and 49 on opposite sides of the dielectric layer 42. The pads 47 and 48 of each respectively circuit pattern are situated near a vertical edge 43 of the dielectric layer 42.

When the second printed circuit substrate 40 is mated or coupled to the first printed circuit substrate 30, as indicated by the heavy arrows, the vertical edge 43 of the second substrate is butted against vertical edge 31 of the first substrate. Likewise, pads 47 are mated to pads 37, and pads 48 are mated to pads 38. In this way, electrical interconnection is made between circuit pattern 46 and circuit pattern 36 and also between circuit pattern 49 and circuit pattern 39. The tongue or tab formed by the end of the dielectric layer 42 now situated in the groove or slot formed in the printed circuit substrate 30 forms a tongue-and-groove joint, providing mechanical structure and rigidity to the printed circuit board interconnection. As previously described, fastening means may be used to further maintain the relative positions of substrate 40 to substrate 30, or conductive adhesives or solder may also be applied to the electrical interconnection, and also to add mechanical strength to the overall assembly.

Figure 4:
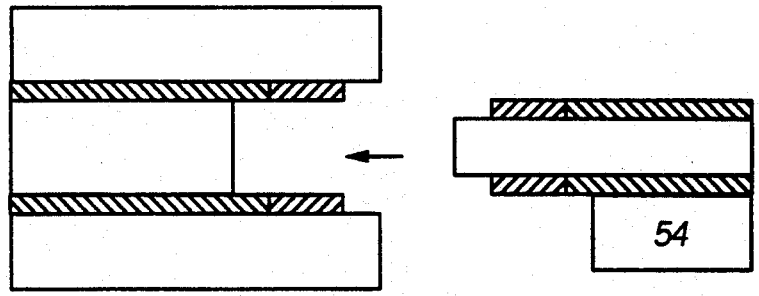

In another embodiment of the invention as shown in FIG. 4, an additional dielectric layer 54 is added to the second printed circuit substrate 50. The purpose of this dielectric layer is to cover the circuit pattern 56 and also to add a multilayer structure to the second printed circuit board 50. When the second printed circuit board 50 is coupled to the first printed circuit board 60, the presence of the second dielectric layer 54 further adds to the mechanical rigidity of the structure.

Figure 5:
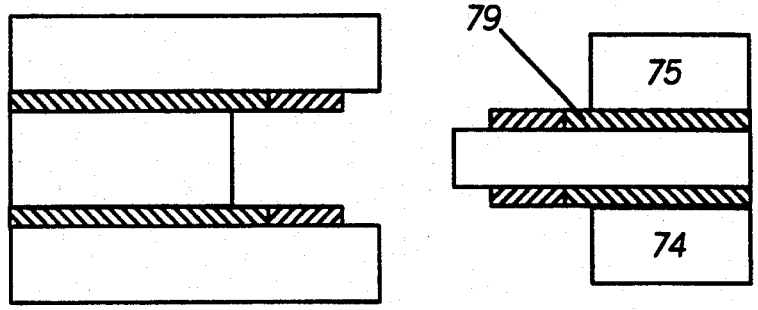

In still a further embodiment shown in FIG. 5, a third dielectric layer 75 is added to printed circuit substrate 70 in order to form a three-layer, multilayer structure. The third dielectric layer 75 is laminated to circuit pattern 79. The resulting structure forms a multilayer circuit board with a tab extending from one end. This structure can now be coupled to the first printed circuit structure 80 in a tongue-and-groove like manner.

Figure 6:
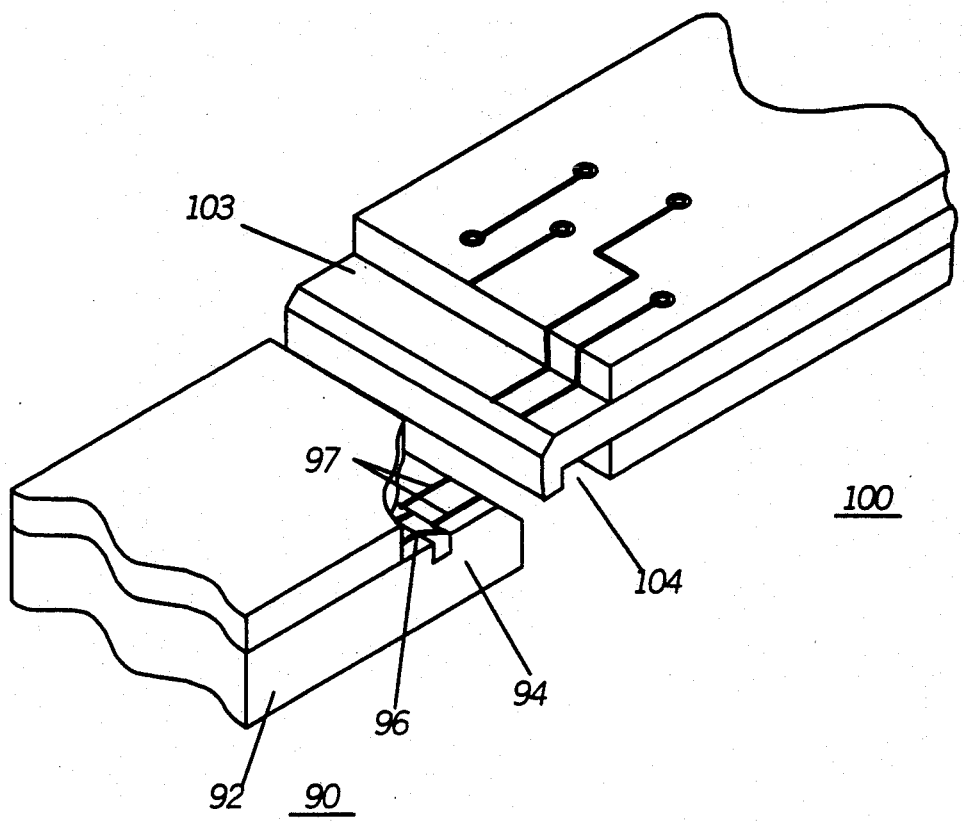
FIG. 6 is a cut-away isometric view of an alternate embodiment of the invention.

Another embodiment of the invention is shown in FIG. 6. The first printed circuit substrate 90 has a notch or groove 94 formed into the dielectric layer 92. The notch 94 is transverse to the pads 97 of the circuit pattern 96. A corresponding protrusion or hook 104 in the second printed circuit substrate 100 is formed on the tab 103 extending from the edge of the substrate. When the second printed circuit substrate 100 is mated to the first printed circuit substrate 90, protrusion 104 hooks into the notch 94 so as to interlock the two substrates together. When such a system is employed, the printed circuit substrates 90 and 100 would typically be formed by a molded circuit process. The process of forming molded circuitry is well known to those skilled in the art, see, for example, U.S. Pat. No. 4,415,607. The circuitry can be formed on more than one layer and may be formed in a three-dimensional pattern to extend from the tab 103 upwards onto the surface of the printed circuit substrate 100.

Figure 7:
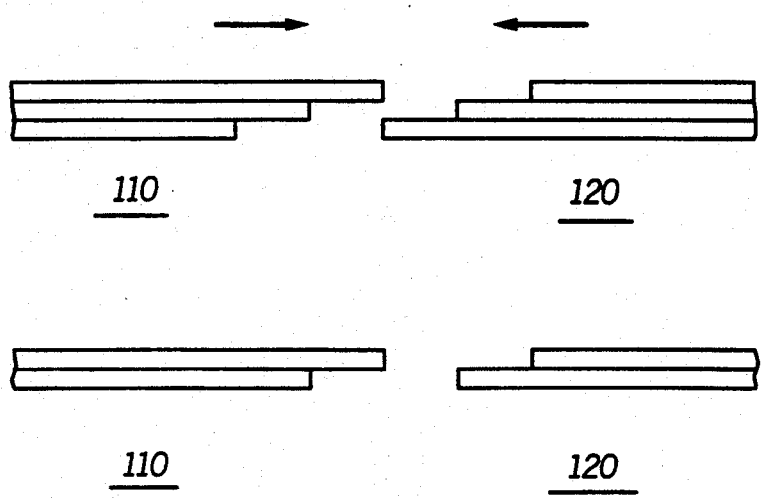
FIG. 7 is a cross-sectional view of alternate embodiments of the invention.
Figure 8:
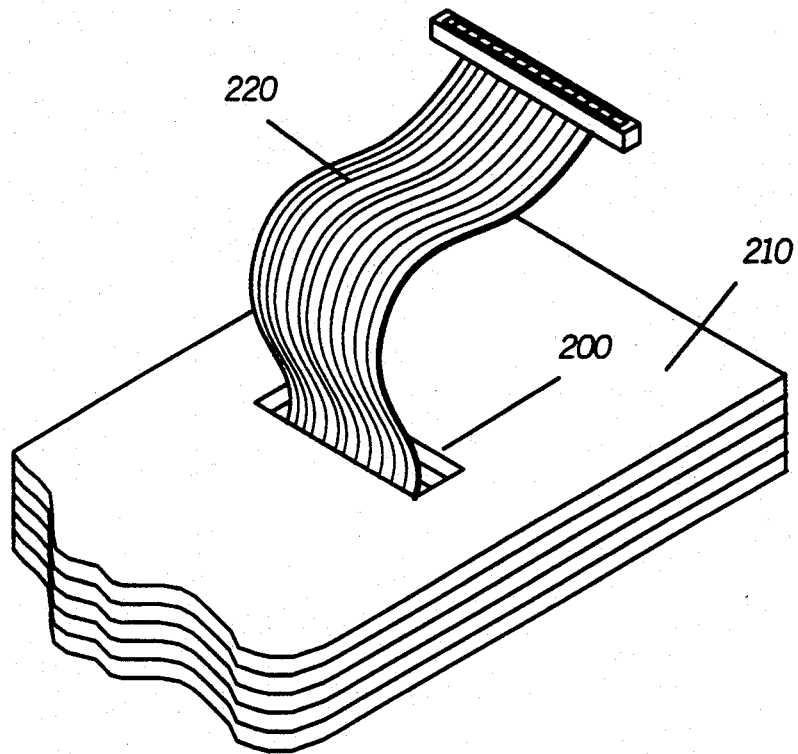
FIG. 8 is an isometric view of a flexible circuit interconnection with a printed circuit board in accordance with the invention.
Figure 9:
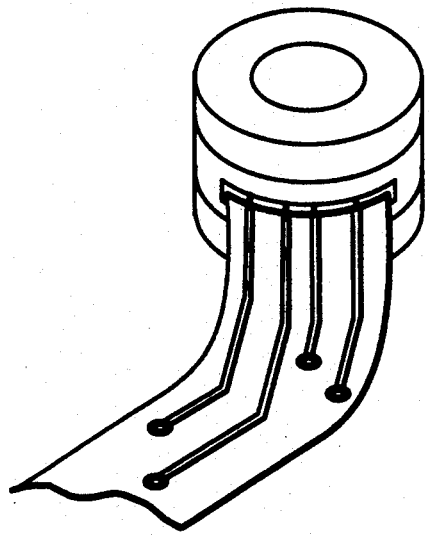
FIG. 9 is an isometric view of an alternate embodiment of a flexible circuit interconnecting with a rigid circuit in accordance with the invention.
Figure 10:
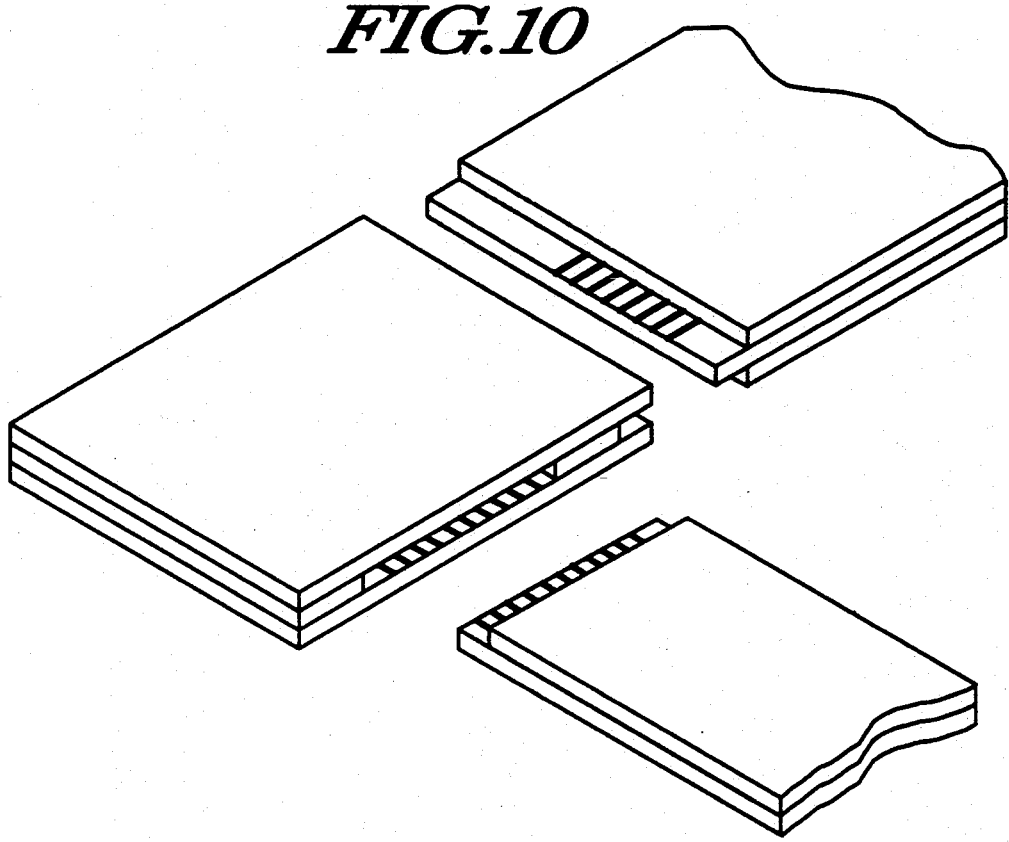
FIG. 10 is an exploded view of multiple printed circuit interconnections in accordance with the invention.
Figure 11:
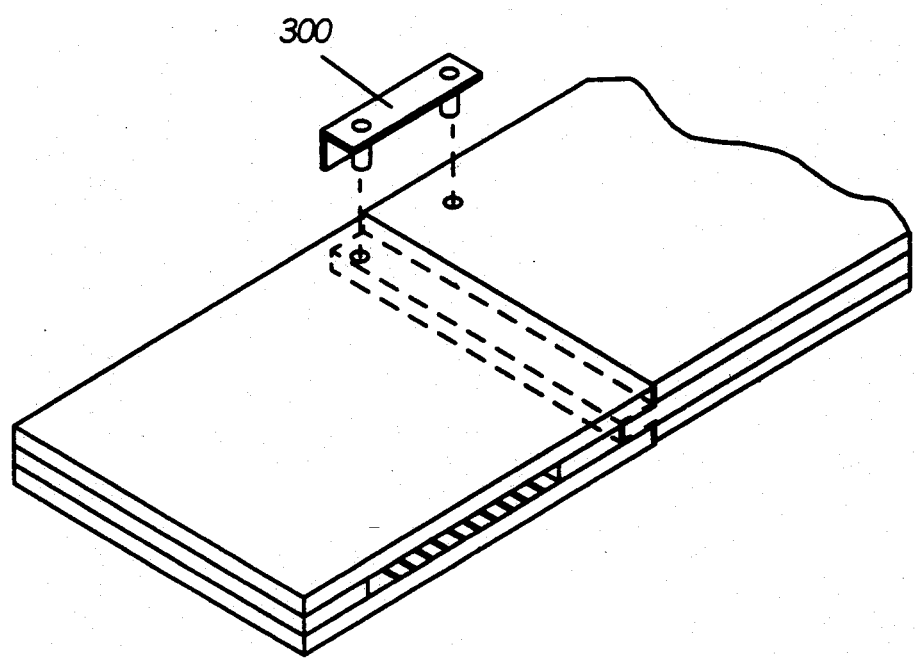
FIG. 11 is an isometric view of a fastening means used in accordance with the invention.

Additional configurations of the printed circuit interconnect scheme may be seen in FIG. 7 wherein a step multilayer structure is coupled to another step-multilayer structure 120, and in FIG. 8 where the interconnection area is not on the perimeter of the circuit board but is in the interior portion. In this case, the edge connection is formed by creating an opening 200 in the printed circuit board 210 and a second printed circuit substrate 220 is inserted into the opening in the board. Typically, the second printed circuit substrate 220 would be a flexible material such as a flex circuit made of KAPTON ® or MYLAR ®. FIG. 9 shows an embodiment where the interconnection between the two printed circuit substrates is not in a straight line but in an arc or circular pattern. In addition, multiple interconnections may be made as shown in FIG. 10, where three circuit boards are interconnected. FIG. 11 shows still another embodiment of a fastening method wherein a bracket 300 containing pins is added to the two substrates in order to provide rigidity and mechanical structure. One skilled in the art of designing interconnections can easily appreciate the fact that numerous shapes of interconnections and tabs may be formed and still fall within the spirit and scope of the invention.

Having now described the structure of the invention, a method of forming the multilayer interconnection will now be described. Typical printed circuit boards are formed by laminating one or more layers of dielectric material. The dielectric layers referred to as "prepreg" are typically laid up on top of each other and laminated together by heat and pressure in a press. In order to form the circuitry on the inner layer, the circuit pattern is delineated, etched, and plated prior to the lamination step. Referring now to FIG. 2, for example, a proposed method of forming the structure will now be described. Circuit pattern 36, including the lands 37, is first imaged and etched on prepreg layer 32 using conventional means. A second piece of prepreg 34, slightly smaller than the first piece 32, is laid upon and aligned with the first dielectric layer or prepreg 32. A third piece of prepreg 35 is formed with the circuit pattern 39 and respective pads 38 delineated or etched thereon. Prepreg 35 is now laid atop prepregs 34 and 32 so as to form a three-layer prepreg structure. In order to maintain the gap between layers 32 and 35, a spacer (not shown) is inserted into the slot formed by layers 32, 34, and 35. The spacer must be a material that will not bond or adhere to any of the prepreg layers and is typically a TEFLON ®-coated or silicone-coated material such as aluminum or other metal, or it may be a solid piece of TEFLON ®. The entire stack of the three prepregs and the spacer is now placed in a laminating press and the three layers of prepreg are laminated together using conventional methodology of heat and pressure. The corresponding mating substrate 40 is formed of a single layer of laminate 42 with the circuitry patterns 46 and 49 etched and delineated on opposite sides of the pattern. If additional layers of dielectric material, as shown in FIGS. 4 and 5, are desired to be placed on the dielectric layer 40. They may be formed in a manner similar to that described for forming the first printed circuit substrate. That is, prepreg layers are laid up on both sides of the dielectric layer 42 so as to expose the pads 47 and 48 on the respective circuitry patterns. This may also be done by the use of a spacer in a laminating structure, and the resulting laminate is then cured in a lamination press. After curing and removal of the structures from the laminating press, the spacers are removed, leaving the slot in the first printed circuit substrate 30 open, and the pads 37 and 38 exposed and ready to be interconnected with pads 47 and 48 with the second printed circuit substrate.

Alternatively, the structure may be formed by a molded printed circuit process. Numerous molded printed circuit processes are readily known to those skilled in the art and may be used in order to form the desired structure. In this case, rather than laminating the structure using partially cured epoxy prepregs, the structure would be made by a molded circuit process using injection molded thermoplastics to form each of the printed circuit substrates. During the injection molding process, an appropriately formed mold is used to create the appropriate grooves and protrusions in the corresponding substrates.

Having described various embodiments of the instant invention, one skilled in the art will now appreciate that this invention provides a significant advantage over the prior art in interconnecting two or more printed circuit substrates. The bulky, expensive card/edge connectors typically required in the past may now be eliminated and a lower cost, more efficient, and smaller interconnection may be formed using the technique and method of the instant invention. Although various embodiments have been described in the drawing figures and in the text, it is not intended that the aforementioned invention be limited except as by the appended claims.

In order to aid the reader and prevent confusion, the dielectric layers previously described will be designated in the claims as layer A, B, C, etc., and the corresponding surfaces and circuit patterns will be designated as A1, B1, B2, etc. One skilled in the art will certainly appreciate that although the description and figures are limited to three layers of dielectric material, additional dielectric layers and metallization layers may be employed to make a more efficient and complex interconnection if desired.

What is claimed is:

1. A printed circuit substrate interconnection, comprising:
    two printed circuit substrates;
    the first printed circuit substrate comprising a laminate of at least three dielectric layers, layer A and layer B and layer C, layer A having two major opposed faces, A1 and A2, layer B having two major opposed faces, B1 and B2, and layer C having two major opposed faces;
    face A1 having a circuit pattern A3 terminating in one or more lands located near a vertical edge of layer A;
    layer B laminated to layer A, over the circuit pattern A3 and face A1, so as to reveal at least the lands; and
    layer C having a circuit pattern C1 on a major face and terminating in one or more lands located near a vertical edge of layer C, layer C laminated to layer B with circuit pattern C1 facing B2 so as to reveal at least the lands of layer C;
    the second printed circuit substrate comprising a laminate of at least one dielectric layer J, layer J having two major opposed faces J1 and J2, face J1 having a circuit pattern J3 terminating in one or more lands, the lands being located near a vertical edge of layer J and in a pattern corresponding to the lands of circuit pattern A3, and a circuit pattern J4, on face J2, terminating in one or more lands, the lands being located near a vertical edge of layer J and in a pattern corresponding to the lands of circuit pattern C1; and
    the first printed circuit substrate coupled to the second printed circuit substrate so as to cooperatively mate and couple the first and second printed circuit substrates by means of a notch or groove in face A1 and a corresponding protrusion in face J1, said protrusion coupling with said notch or groove to form an electrical interconnection between the circuit pattern A3 lands and the circuit pattern J3 lands.

* * * * *